United States Patent
Wu et al.

(10) Patent No.: US 8,927,358 B2
(45) Date of Patent: Jan. 6, 2015

(54) METAL OXIDE SEMICONDUCTOR DEVICE HAVING A PREDETERMINED THRESHOLD VOLTAGE AND A METHOD OF MAKING

(75) Inventors: Po-Chi Wu, Zhubei (TW); Ryan Chia-Jen Chen, Chiayi (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/286,605

(22) Filed: Nov. 1, 2011

(65) Prior Publication Data
US 2013/0105915 A1 May 2, 2013

(51) Int. Cl.
| | | |
|---|---|---|
| H01L 21/441 | (2006.01) | |
| H01L 21/3205 | (2006.01) | |
| H01L 29/78 | (2006.01) | |
| H01L 21/02 | (2006.01) | |
| H01L 21/3213 | (2006.01) | |
| H01L 29/49 | (2006.01) | |
| H01L 29/66 | (2006.01) | |
| H01L 29/51 | (2006.01) | |

(52) U.S. Cl.
CPC .... *H01L 21/02186* (2013.01); *H01L 21/02244* (2013.01); *H01L 21/02252* (2013.01); *H01L 21/32137* (2013.01); *H01L 29/4966* (2013.01); *H01L 29/66545* (2013.01); *H01L 29/517* (2013.01)

USPC .......... 438/197; 438/585; 438/592; 257/407; 257/368; 257/402

(58) Field of Classification Search
CPC .......................... H01I 29/4958; H01I 29/4966
USPC ................... 257/407, 368, 402; 438/197, 199
See application file for complete search history.

(56) References Cited

U.S. PATENT DOCUMENTS

| | | | |
|---|---|---|---|
| 7,754,594 B1 | 7/2010 | Chudzik et al. | |
| 2012/0119204 A1* | 5/2012 | Wong et al. | 257/43 |

* cited by examiner

*Primary Examiner* — Matthew W Such
*Assistant Examiner* — Scott Stowe
(74) *Attorney, Agent, or Firm* — Lowe Hauptman & Ham, LLP

(57) ABSTRACT

A metal-oxide-semiconductor (MOS) device having a selectable threshold voltage determined by the composition of an etching solution contacting a metal layer. The MOS device can be either a p-type or n-type MOS and the threshold voltage is selectable for both types of MOS devices. The etching solution is either an oxygen-containing solution or a fluoride-containing solution. The threshold voltage is selected by adjusting the flow rate of inert gases into an etching chamber to control the concentration of oxygen gas or nitrogen trifluoride.

20 Claims, 3 Drawing Sheets

METAL OXIDE SEMICONDUCTOR DEVICE HAVING A PREDETERMINED THRESHOLD VOLTAGE AND A METHOD OF MAKING

BACKGROUND

As the technology nodes shrink in some integrated circuit (IC) designs, there has been a desire to replace the typical polysilicon gate electrode with a metal gate electrode to improve device performance with decreased feature size. However, as the gate length and spacing between devices decreases a number of problems arise. For example, it is difficult to select or tune a threshold value for metal-oxide-semiconductor (MOS) devices. It is also difficult to find a metal capable of adequately filling the decreased feature size.

Conventionally techniques use two types of processes are used to tune a threshold voltage. The gap fill metal selection method involves determining a work function metal material which provides a desired threshold voltage. The gap fill metal selection method allows tuning of n-type and p-type MOS devices separately. Gap fill metal selection, however, involves costly experimentation and research into various metals and alloys to find an acceptable material. Even when an acceptable material is found, the material often can not adequately fill the small feature size. The pre-film treatment subjects the gate layer dielectric to a treatment prior to depositing a metal layer. The treatment alters the gate layer dielectric permittivity thereby changing the threshold voltage. However, the pre-film treatment method does not allow a designer to tune n-type and p-type MOS devices separately.

BRIEF DESCRIPTION OF DRAWINGS

The present disclosure may be understood from the following detailed description when read with the accompanying figures. It is emphasized that in accordance with the standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are of course, merely examples and are not intended to be limiting. For example, the formation of a first feature over or on a second feature in the description that follows includes embodiments in which the first and second features are formed in direct contact, and also includes embodiments in which additional features are formed between the first and second features.

Figure 1:
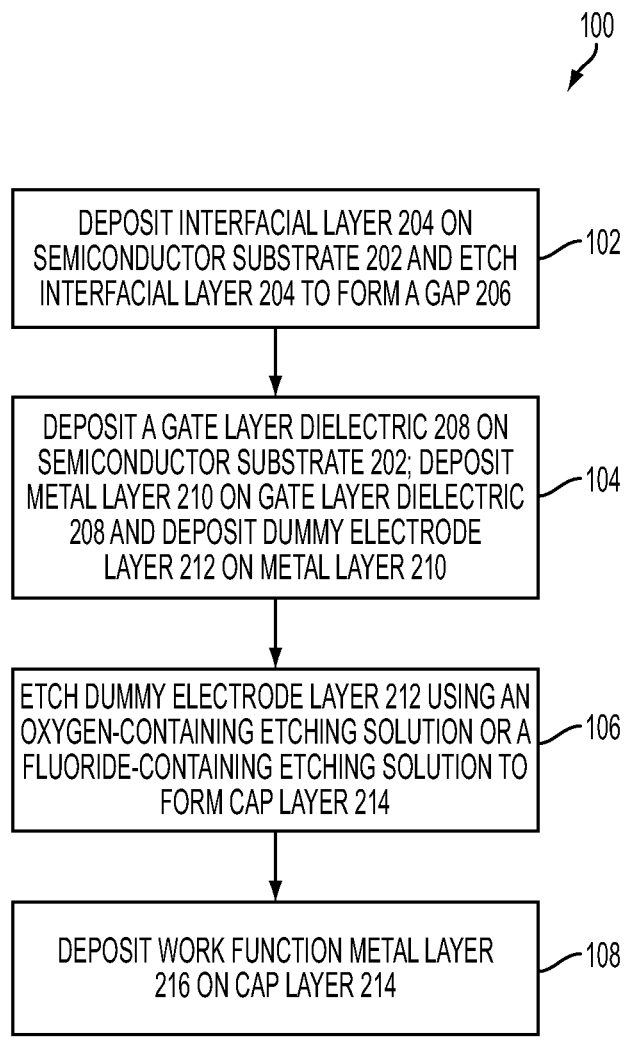
FIG. 1 is a flowchart illustrating a method of fabricating a MOS device comprising a metal gate structure according to some embodiments.

FIG. 1 is a flowchart illustrating a method 100 of fabricating a MOS device comprising a metal gate structure according to some embodiments. FIGS. 2A-2D are schematic cross-sectional views of a metal gate structure of a MOS device at various stages of fabrication according to some embodiments. FIGS. 1 and 2A-2D are simplified for a better understanding of the concepts of the present disclosure. For example, although the figures illustrate the metal gate structure for a MOS device it is understood the MOS device may be part of an integrated circuit that may include a number of other devices including resistors, capacitors, inductors, fuses, etc.

Figure 2A:
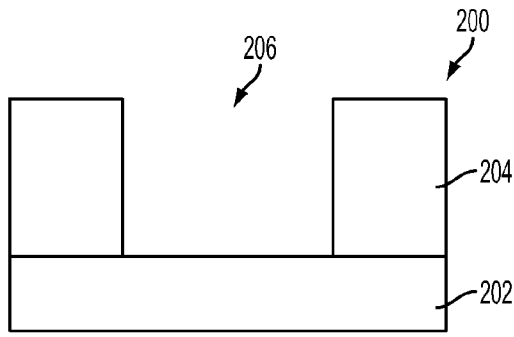
FIGS. 2A-2D are schematic cross-sectional views of a metal gate structure of an MOS device at various stages of fabrication according to some embodiments.

Method 100 begins with step 102 in which an interfacial layer 204 shown in FIG. 2A is deposited on a semiconductor substrate 202 and etched to form a gap 206. In an embodiment, the semiconductor substrate 202 is silicon. In other embodiments, the semiconductor substrate 202 is germanium, gallium arsenic, or other suitable materials. Further, the substrate 202 may alternatively be made of some other suitable elementary semiconductor, such as diamond; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. In still other embodiments, the substrate 202 could include an epitaxial layer (epi layer), may be strained for performance enhancement, and may include a silicon-on-insulator (SOI) structure.

In an embodiment, the interfacial layer 204 is silicon oxide. In an embodiment, the etching process to form the gap 206 is a dry etching process. In other embodiments, the etching process is a wet etching process, a plasma etching process or other suitable etching process.

Figure 2B:
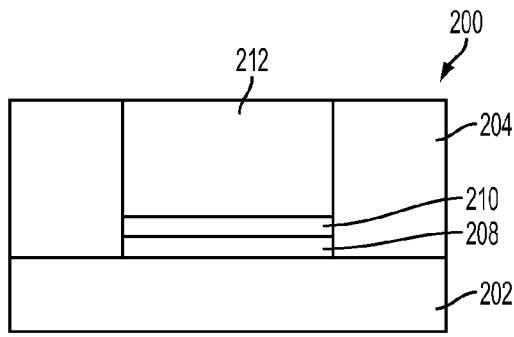

The method 100 continues with step 104 in which a gate layer dielectric 208, metal layer 210 and dummy electrode 212 shown in FIG. 2B are sequentially formed in the gap 206. In an embodiment, the gate layer dielectric 208 includes a high k dielectric layer. High k dielectric materials have a dielectric constant, k, greater than about 4.0. High k dielectrics include certain metal oxides such as oxides of lithium, beryllium, magnesium, calcium, strontium, zirconium, hafnium, aluminum and mixtures thereof. In other embodiments, the gate layer dielectric includes silicon oxide, silicon nitride, silicon oxynitride or other suitable materials. In an embodiment, gate layer dielectric 208 is formed using physical vapor deposition (PVD). In other embodiments, gate layer dielectric 208 is formed using atomic layer deposition (ALD), chemical vapor deposition (CVD), thermal oxidation or other suitable processes. In some embodiments, an additional interfacial layer (not shown) is deposited between the gate layer dielectric 208 and the semiconductor substrate 202.

Figure 2C:
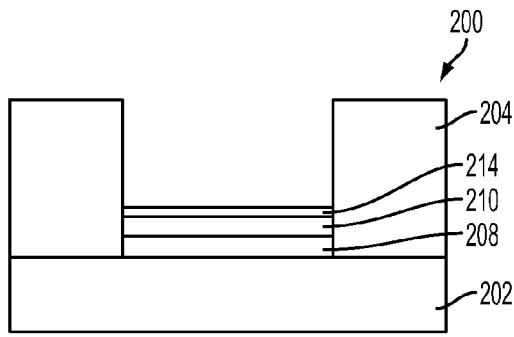
Figure 2D:
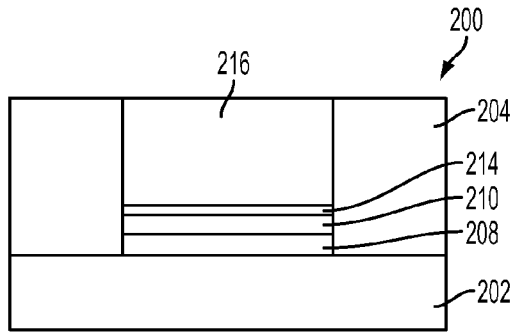

The metal layer 210 is deposited on the gate layer dielectric 208. In the embodiment of FIGS. 2B-2D, the metal layer 210 includes titanium nitride (TiN). In other embodiments, the metal layer 210 includes titanium, tantalum, tantalum nitride or other suitable materials. In an embodiment, the metal layer 210 is formed using PVD. In other embodiments, the metal layer 210 is formed using CVD, ALD or other suitable processes. In the embodiment of FIGS. 2B-2D, the metal layer 210 helps to prevent atomic diffusion from a work function metal layer 216 (shown in FIG. 2D) into the gate layer dielectric 208.

The dummy gate electrode 212 (shown in FIG. 2B) is formed on the metal layer 210. The dummy gate electrode 212 is either a single layer or a multilayer structure. In the embodiment of FIG. 2B, the dummy gate electrode 212 is a single layer. In an embodiment, the dummy gate electrode 212 is polysilicon. In other embodiments, the dummy gate electrode 212 is a doped polysilicon or other suitable material. The dummy gate electrode 212 is formed by low-pressure CVD, plasma-enhanced CVD or other suitable processes.

Method 100 continues with step 106 in which the dummy gate electrode 212 is etched using either an oxygen-containing solution or a fluoride-containing solution. In the embodiment of FIGS. 1 and 2A-2D, the etching process is carried out at a pressure of about 2 mTorr to about 25 mTorr, using a bias up to about 300 W and a source of about 400 W to about 1300 W. One of ordinary skill in the art would recognize the ability to alter the etching conditions without departing from the spirit and scope of the description.

The etching solution removes the dummy gate electrode 212 and forms a cap layer 214 in the metal layer 210. The cap layer 214 forms in the portion of the metal layer 210 exposed to the etching solution once the entire dummy electrode 212 is substantially removed. The cap layer 214 enhances the protection against atomic diffusion from the work function metal layer 216 (shown in FIG. 2D) into the gate layer dielectric 208 provided by metal layer 210. Atomic diffusion from the work function metal layer 216 into the gate layer dielectric 208 would alter the threshold voltage of the MOS device 200. In the embodiment of FIG. 2C, the cap layer 214 is a titanium oxide (TiO$_x$).

By forming the cap layer 214 in the metal layer 210, instead of as an extra layer on metal layer 210, the distance between the gate layer dielectric 208 and the work function metal layer 216 remains constant in all embodiments. The distance between the gate layer dielectric 208 and the wok function metal layer 216 impacts the threshold voltage, so maintaining a constant distance will minimize the optimization required to achieve a desired threshold voltage.

In an embodiment, the etching process occurs in a sealed chamber and the gases forming the etching solution are introduced into the chamber using gas inlets. The flow rates of the gases are controlled using valves on each gas inlet. In an embodiment, the valves are automatically controlled through a controller connected to each valve. The concentration of the gases in the etching solution changes as the valves are opened or closed to adjust the gas flow rate.

In an embodiment, the oxygen-containing solution includes hydrogen bromide gas (HBr), chlorine gas (Cl$_2$), oxygen gas (O$_2$) and optionally inert noble gases. Inert noble gases include argon (Ar), helium (He) and other suitable noble gases. In an embodiment, the hydrogen bromide gas concentration is about 2% to about 90% by volume, the chlorine gas concentration is about 0.5% to about 30% by volume and the oxygen gas concentration is about 0.5% to about 10% by volume. In an embodiment, the flow rates of hydrogen bromide gas, chlorine gas and oxygen gas are held constant and the flow rate of the inert noble gas is adjusted to change the gas concentrations in the etching chamber. The inert noble gases are used as filler to selectively adjust the concentration of oxygen gas. Thus, as the oxygen gas concentration increases the thickness of the cap layer 214 increases because more of the metal layer 210 is oxidized. The concentration of oxygen gas has a positive relationship with the threshold voltage, meaning that as the oxygen gas concentration increases up to a certain value the threshold voltage reaches a maximum.

Figure 3:
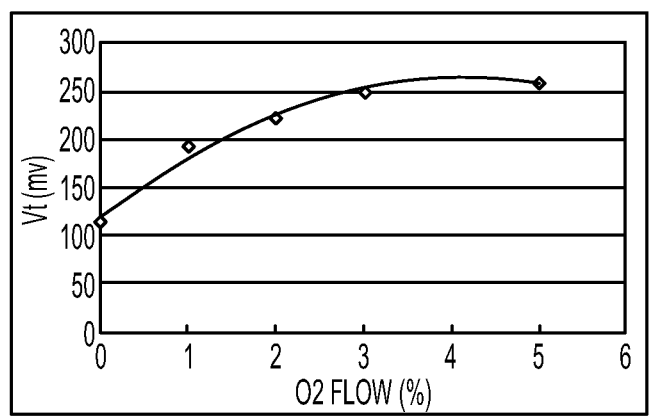
FIG. 3 is a graph of the threshold voltage of the MOS device as a function of oxygen concentration in the etching solution according to some embodiments.

As shown in FIG. 3, an increase in oxygen gas concentration increases the threshold voltage, until the threshold voltage reaches a maximum at an oxygen gas concentration of about 5% by volume. This allows a designer to select a desired threshold voltage by adjusting the flow rate of the gases during the dummy gate electrode etching process. The flexibility of tuning the threshold voltage using concentrations in the etching solution allows the selection of a threshold voltage for each type of MOS device or even specific MOS devices within the integrated circuit by designing a desired etching mask. For example, if a designer intends the threshold voltage of the MOS device to be about 175 mV, the flow rate of the inert noble gases will be adjusted so the oxygen concentration is about 1% by volume. In order to ensure precise setting of the threshold voltage, the gas flow rates are set prior to beginning the etching process. Gas flow rates are adjusted between the etching processes for different wafers.

In another embodiment, the fluorine-containing solution includes hydrobromic acid (HBr), chlorine gas (Cl$_2$), nitrogen trifluoride (NF$_3$) and optionally inert noble gases. Inert noble gases include argon (Ar), helium (He) and other suitable noble gases. In an embodiment, the hydrobromic acid concentration is about 2% to about 90% by volume, the chlorine gas concentration is about 0.5% to about 30% by volume and the nitrogen trifluoride concentration is about 1% to about 5% by volume. In an embodiment, the flow rates of hydrobromic acid, chlorine gas an nitrogen trifluoride are held constant and the flow rate of the inert noble gas is adjusted to change the gas concentrations in the etching chamber. The inert noble gases are used as filler to selectively adjust the concentration of nitrogen trifluoride. The concentration of nitrogen trifluoride alters the amount of oxygen in the cap layer 214. In the embodiment of FIG. 2C, the cap layer 214 includes a titanium oxide (TiOx), as the concentration of nitrogen trifluoride increases the value of x decreases because oxygen is leached out of the cap layer 214 by the etching solution. As the concentration of nitrogen trifluoride in the etching solution increases, the amount of oxygen in the cap layer decreases. The concentration of nitrogen trifluoride has an inverse relationship with the threshold voltage, meaning that as the nitrogen trifluoride concentration increases up to a certain value the threshold voltage reaches a minimum.

As shown in FIG. 3, when the oxygen concentration is below 0.1% by volume the threshold voltage of the MOS device reaches a minimum value. The fluoride-containing solution will therefore be selected when a low threshold voltage is desired. For example, if a designer intends to operate the MOS device at a very low voltage, the flow rate of the inert noble gases will be adjusted to increase the concentration of nitrogen trifluoride to about 5% by volume to minimize the oxygen concentration in the cap layer 214 producing a threshold voltage of about 110 mV.

Method 100 concludes with step 108, in which the work function metal layer 216 is formed on the cap layer 214. In the embodiment of FIG. 2D, the work function metal layer 216 is aluminum and the MOS device is a p-type MOS (PMOS). Other work function metal layer materials for forming PMOS include copper and tungsten or other suitable materials. In other embodiments, the work function metal layer 216 is lanthanum and the MOS device is an n-type MOS (NMOS). Other work function metal layer materials for forming NMOS include titanium, gold, zirconium, titanium alloys or other suitable material. The work function metal layer 216 is deposited using PVD, CVD or other suitable processes.

One aspect of the description relates to an MOS device including a gate layer dielectric on a semiconductor substrate, a metal layer over the gate layer dielectric and a cap layer formed in the metal layer by contacting the metal layer with an etching solution, the MOS device having a threshold voltage determined by the composition of the etching solution. Another aspect of the description relates to a method of making an MOS device including depositing a gate layer dielectric over a semiconductor substrate, depositing a metal layer over the gate layer dielectric and forming a cap layer in the metal layer using an etching solution wherein the threshold voltage of the MOS device is selected by altering the composition of the etching solution. A further aspect of the description relates to a method of making an MOS device including depositing a gate layer dielectric over a semiconductor substrate, depositing a metal layer over the gate layer dielectric, depositing a dummy electrode layer over the metal layer and forming a cap layer in the metal layer by removing the dummy electrode layer using an etching solution, wherein a threshold voltage of the MOS device is selected by altering the composition of the etching solution.

While the description is presented by way of examples and in terms of specific embodiments, it is to be understood that the invention is not limited to the disclosed embodiments. To the contrary, it is intended to cover various modifications and similar arrangements (as would be apparent to those skilled in the art). The above description discloses exemplary steps, but they are not necessarily required to be performed in the order described. Steps can be added, replaced, change in order, and/or eliminated as appropriate, in accordance with the spirit and scope of the description. Embodiments that combine different claims and/or different embodiments are within the scope of the description and will be apparent to those skilled in the art after reviewing this disclosure. Therefore, the scope of the appended claims should be accorded the broadest interpretation so as to encompass all such modifications and similar arrangements.

The invention claimed is:

1. A method of making a metal-oxide-semiconductor (MOS) device having a predetermined threshold voltage comprising:
   depositing a gate layer dielectric on a semiconductor substrate;
   depositing a metal layer on the gate layer dielectric;
   forming a cap layer in the metal layer using an etching solution;
   removing a dummy electrode layer using the etching solution, wherein forming the cap layer and removing the dummy electrode layer occur simultaneously; and
   selecting the threshold voltage of the MOS device by altering a composition of the etching solution.

2. The method of claim 1, wherein the gate layer dielectric is a high k dielectric layer, wherein the dielectric constant, k, is greater than or equal to about 4.0.

3. The method of claim 1, wherein the metal layer comprises titanium nitride (TiN).

4. The method of claim 1, wherein the cap layer comprises a titanium oxide ($TiO_x$).

5. The method of claim 1, wherein the etching solution comprises hydrobromic acid (HBr), chlorine gas ($Cl_2$), at least one inert noble gas and one of oxygen gas ($O_2$) or nitrogen trifluoride ($NF_3$).

6. The method of claim 5, wherein the etching solution comprises:
   a concentration of hydrobromic acid between about 2% and about 90% by volume;
   a concentration of chlorine gas between about 0.5% and about 30% by volume; and
   a concentration of oxygen gas between about 0.5% and about 10% by volume.

7. The method of claim 5, wherein the etching solution comprises:
   a concentration of hydrobromic acid between about 2% and about 90% by volume;
   a concentration of chlorine gas between about 0.5% and about 30% by volume; and
   a concentration of nitrogen trifluoride between about 1% and about 5% by volume.

8. The method of claim 6, wherein the oxygen gas concentration has a positive relationship with a threshold voltage of the MOS device.

9. The method of claim 7, wherein the nitrogen trifluoride concentration has an inverse relationship with a threshold voltage of the MOS device.

10. A method of making a metal-oxide-semiconductor (MOS) device having a predetermined threshold voltage comprising:
    depositing a gate layer dielectric on a semiconductor substrate;
    depositing a metal layer on the gate layer dielectric;
    depositing a dummy electrode layer on the metal layer;
    forming a cap layer in the metal layer by etching the dummy electrode layer using an etching solution; and
    selecting the threshold voltage of the MOS device by altering a composition of the etching solution.

11. The method of claim 10, wherein the etching solution comprises:
    a concentration of hydrobromic acid between about 2% and about 90% by volume;
    a concentration of chlorine gas between about 0.5% and about 30% by volume;
    a concentration of oxygen gas about 1% by volume, and the threshold voltage of the MOS device is about 175mV.

12. A metal-oxide-semiconductor (MOS) device having a predetermined threshold voltage comprising:
    a gate layer dielectric disposed on a semiconductor substrate;
    a metal layer disposed on the gate layer dielectric;
    a cap layer formed in the metal layer by contacting the metal layer with an etching solution;
    a work function layer in direct contact with the cap layer, wherein the work function layer is selected from the group consisting of aluminum, lanthanum, titanium, gold, zirconium, copper, and tungsten; and
    the threshold voltage determined by a composition of the etching solution.

13. The MOS device of claim 12, wherein the threshold voltage of the MOS device is about 175 mV and a concentration of oxygen in the etching solution of about 1% by volume.

14. The MOS device of claim 12, wherein the gate layer dielectric is a high k dielectric layer, wherein the dielectric constant, k, is greater than or equal to about 4.0.

15. The MOS device of claim 12, wherein the metal layer comprises titanium nitride (TiN).

16. The MOS device of claim 12, wherein the cap layer comprises a titanium oxide ($TiO_x$).

17. The MOS device of claim 12, wherein the etching solution comprises hydrobromic acid (HBr), chlorine gas ($Cl_2$) and one of oxygen gas ($O_2$) or nitrogen trifluoride ($NF_3$).

18. The MOS device of claim 17, wherein the etching solution further comprises an inert noble gas.

19. The MOS device of claim 17, wherein the etching solution comprises a hydrobromic acid concentration between about 2% to about 90% by volume, a chlorine gas concentration between about 0.5% to about 30% by volume and an oxygen gas concentration between about 0.5% to about 10% by volume.

20. The MOS device of claim 17, wherein the etching solution comprises a hydrobromic acid concentration between about 2% to about 90% by volume, a chlorine gas concentration between about 0.5% to about 30% by volume and a nitrogen trifluoride concentration between about 1% to about 5% by volume.

* * * * *